US012382795B2

United States Patent
Lv et al.

(10) Patent No.: US 12,382,795 B2
(45) Date of Patent: Aug. 5, 2025

(54) DISPLAY PANEL AND DISPLAY DEVICE WITH SHIELDING LAYER IN FIRST AND SECOND DISPLAY AREAS

(71) Applicant: Wuhan China Star Optoelectronics Semiconductor Display Technology Co., Ltd., Hubei (CN)

(72) Inventors: Lei Lv, Hubei (CN); Meng Jin, Hubei (CN); Lin Yang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/623,896

(22) PCT Filed: Dec. 21, 2021

(86) PCT No.: PCT/CN2021/139875
§ 371 (c)(1),
(2) Date: Dec. 30, 2021

(87) PCT Pub. No.: WO2023/108705
PCT Pub. Date: Jun. 22, 2023

(65) Prior Publication Data
US 2024/0431157 A1    Dec. 26, 2024

(30) Foreign Application Priority Data
Dec. 14, 2021    (CN) .......................... 202111527786.9

(51) Int. Cl.
*H10K 59/126*    (2023.01)
*H10K 59/131*    (2023.01)
*H10K 59/65*    (2023.01)

(52) U.S. Cl.
CPC ......... *H10K 59/126* (2023.02); *H10K 59/131* (2023.02); *H10K 59/65* (2023.02)

(58) Field of Classification Search
CPC ..... H10K 59/126; H10K 59/131; H10K 59/65
See application file for complete search history.

(56) References Cited

U.S. PATENT DOCUMENTS 9,711,583 B2 * 7/2017 Choo ................ H10D 30/6723
2009/0026454 A1   1/2009 Kurokawa et al.
(Continued)

FOREIGN PATENT DOCUMENTS

CN    110277510    9/2019
CN    111710707    9/2020
(Continued)

OTHER PUBLICATIONS

International Search Report and the Written Opinion Dated Aug. 25, 2022 From the International Searching Authority Re. Application No. PCT/CN2021/139875 and Its Translation Into English. (20 Pages).

(Continued)

*Primary Examiner* — Lex H Malsawma

(57) ABSTRACT

A display panel and a display device are provided. The display panel includes a substrate layer and a light-emitting layer. The substrate layer includes a first shielding layer corresponding to a first display area. The light-emitting layer comprises first light-emitting pixels arranged in the first display area and second light-emitting pixels arranged in a second display area. The first shielding layer includes: a first shielding sub-part corresponding to the first light-emitting pixel and a second shielding sub-part connecting two adjacent first shielding sub-parts.

16 Claims, 5 Drawing Sheets

(56) References Cited

U.S. PATENT DOCUMENTS

| | | | |
|---|---|---|---|
| 2015/0034921 A1 | 2/2015 | Kim | |
| 2016/0020264 A1* | 1/2016 | Choo | H10D 30/6755 257/40 |
| 2017/0117343 A1* | 4/2017 | Oh | H10K 59/1213 |
| 2019/0131377 A1* | 5/2019 | Kwon | H10K 77/10 |
| 2020/0083309 A1* | 3/2020 | Wang | H10K 59/1216 |
| 2020/0083311 A1* | 3/2020 | Cha | H10D 30/6723 |
| 2020/0321292 A1* | 10/2020 | Park | H10D 86/60 |
| 2021/0193784 A1* | 6/2021 | Hong | H10D 30/6755 |
| 2021/0202666 A1* | 7/2021 | Jung | H10K 59/131 |
| 2021/0384224 A1* | 12/2021 | Tian | H10D 86/0212 |
| 2021/0408194 A1* | 12/2021 | Zhang | H10K 59/126 |
| 2022/0165806 A1* | 5/2022 | Yun | H10K 59/1216 |

FOREIGN PATENT DOCUMENTS

| | | |
|---|---|---|
| CN | 112908199 | 6/2021 |
| CN | 113284911 | 8/2021 |
| CN | 113594210 | 11/2021 |
| CN | 113629208 | 11/2021 |
| CN | 113690223 | 11/2021 |
| CN | 113725272 | 11/2021 |
| KR | 10-2016-0130071 | 11/2016 |

OTHER PUBLICATIONS

Notification of Office Action and Search Report Dated Feb. 16, 2023 From the State Intellectual Property Office of the People's Republic of China Re. Application No. 202111527786.9 and Its Translation Into English.

\* cited by examiner

DISPLAY PANEL AND DISPLAY DEVICE WITH SHIELDING LAYER IN FIRST AND SECOND DISPLAY AREAS

RELATED APPLICATIONS

This application is a National Phase of PCT Patent Application No. PCT/CN2021/139875 having International filing date of Dec. 21, 2021, which claims the benefit of priority of Chinese Patent Application No. 202111527786.9 filed on Dec. 14, 2021. The contents of the above applications are all incorporated by reference as if fully set forth herein in their entirety.

FIELD AND BACKGROUND OF THE INVENTION

The present application relates to a display field, and more particularly to a display panel and a display device.

In the design of organic light-emitting diode display panels, how to achieve full-screen display and under-screen photosensitivity of the display panel has always been a problem, and the most important problem is how to improve the light transmittance of the display panel in the under-screen photosensitive area. The current common design is to dig holes for the photosensitive area of the panel. In this way, the transmittance of the panel will be relatively high, but the area does not emit light and does not display, and it cannot present a full-screen effect, and the display experience for the user is not good. In recent years, the method of increasing the transmittance of the panel by reducing the pixel density of the photosensitive area can achieve a full screen to a certain extent, but the transmittance of the photosensitive area is still less than 18%, which cannot meet the requirements of the photosensitive element under the screen.

The current display panel has a technical problem that the light transmittance of the photosensitive area is low.

SUMMARY OF THE INVENTION

The present application provides a display panel and a display device, which are employed to alleviate the current technical problem of low light transmittance in the photosensitive area of the display panel.

The present application provides a display panel, comprising a first display area and a second display area adjacent to the first display area, wherein the display panel comprises:
  a substrate layer, comprising a first shielding layer corresponding to the first display area;
  a light-emitting layer arranged on a side of the substrate layer, wherein the light-emitting layer comprises: first light-emitting pixels arranged in the first display area and second light-emitting pixels arranged in the second display area, and a number of the first light-emitting pixels is the same as a number of the second light-emitting pixels in a same unit area;
  wherein the first shielding layer comprises: a first shielding sub-part corresponding to the first light-emitting pixel and a second shielding sub-part connecting two adjacent first shielding sub-parts.

In the display panel of the present application, the first display area comprises a photosensitive area and a transition area arranged between the photosensitive area and the second display area;
  the first shielding sub-part further comprises: a third shielding sub-part arranged around the first shielding sub-part and the second shielding sub-part, wherein the second shielding sub-part is connected to two adjacent first shielding sub-parts, or the second shielding sub-part is connected to the adjacent first shielding sub-part and the third shielding sub-part;
  the third shielding sub-part is arranged corresponding to an edge of the photosensitive area.

In the display panel of the present application, the third shielding sub-part further partially overlaps with the transition area.

In the display panel of the present application, a distance between an edge of the third shielding sub-part located in the photosensitive area and an edge of the transition area close to the photosensitive area is greater than or equal to 1 micrometer.

In the display panel of the present application, a distance between the edge of the third shielding sub-part located in the photosensitive area and an edge of the third shielding sub-part located in the transition area is greater than or equal to 10 micrometers.

In the display panel of the present application, the third shielding sub-part completely covers the transition area.

In the display panel of the present application, the light-emitting layer comprises:
  a first electrode, arranged on a side of the substrate layer;
  a light-emitting material layer, arranged on a side of the first electrode away from the substrate layer;
  a second electrode, arranged on a side of the light-emitting material layer away from the substrate layer;
  wherein the second electrode in the first display area corresponds to an area surrounded by the adjacent first shielding sub-part and the second shielding sub-part, and/or a light-transmitting hole is provided corresponding to an area surrounded by the adjacent first shielding sub-part, the second shielding sub-part and the third shielding sub-part, and the light-transmitting hole does not overlap with the first shielding layer.

In the display panel of the present application, a distance between an edge of the orthographic projection of the first shielding sub-part on the light-emitting layer and an edge of the corresponding first electrode is greater than or equal to 2 micrometers.

In the display panel of the present application, the third shielding sub-part overlaps with a first transistor.

In the display panel of the present application, a shape of the first shielding sub-part is the same as a shape of the corresponding first electrode.

In the display panel of the present application, the display panel further comprises:
  a driving circuit layer, arranged between the substrate layer and the light-emitting layer, wherein the driving circuit layer comprises a plurality of first transistors arranged corresponding to the first display area and a plurality of second transistors arranged corresponding to the second display area;
  the substrate layer further comprises a second shielding layer corresponding to the second display area, and the second shielding layer comprises fourth shielding sub-parts corresponding to the second transistors, and a number of the first shielding sub-parts is the same as a number of the fourth shielding sub-parts in a same unit area.

In the display panel of the present application, the fourth shielding sub-parts are electrified.

In the display panel of the present application, the driving circuit layer further comprises: a first wiring being electrically connected to the first transistor and providing a driving signal for the first transistor, and a second wiring connecting the first transistor and the first light-emitting pixel;

wherein in the photosensitive area, the second shielding sub-part overlaps with the first wiring and/or the second wiring.

In the display panel of the present application, the first transistor is arranged in the transition area; in the photosensitive area, the second shielding sub-part is arranged to overlap with the second wiring, and a width of the second shielding sub-part is greater than a width of the second wiring.

In the display panel of the present application, the first wiring is arranged around the edge of the photosensitive area around the transition area, and the third shielding sub-part overlaps with the first wiring, which is at least partially arranged around the edge of the photosensitive area.

In the display panel of the present application, a shape of the second wiring is curved, and a shape of the second shielding sub-part corresponding to the second wiring is curved.

In the display panel of the present application, the first transistor is arranged in the photosensitive area, and the first shielding sub-part is arranged to overlap with the first transistor, and the second shielding sub-part is arranged to overlap with the first wiring, and a width of the second shielding sub-part is greater than a width of the first wiring.

In the display panel of the present application, an edge of at least part of the first shielding sub-parts is wavy or jagged, and edges of the second shielding sub-parts are wavy or jagged, and an edge of the third shielding sub-part close to the photosensitive area is wavy or jagged.

In the display panel of the present application, a shape of the photosensitive area comprises a circle or an ellipse, and an edge shape of the transition area close to the second display area comprises an ellipse.

The present application further provides a display device, comprises the display panel as described above, and a photosensitive element corresponding to the first display area.

The present application provides a display panel and a display device. The display panel comprises a first display area and a second display area adjacent to the first display area. The display panel comprises a substrate layer and a light-emitting layer. The substrate layer comprises a first shielding layer corresponding to the first display area. The light-emitting layer comprises first light-emitting pixels arranged in the first display area and second light-emitting pixels arranged in the second display area, and a number of the first light-emitting pixels is the same as a number of the second light-emitting pixels in a same unit area; the first shielding layer comprises: a first shielding sub-part corresponding to the first light-emitting pixel and a second shielding sub-part connecting two adjacent first shielding sub-parts. In the present application, by providing the first shielding layer comprising the first shielding sub-part and the second shielding sub-part in the first display area, the first shielding layer is employed to shield a part of the light-emitting layer, so that the metal electrode in the light-emitting layer can be patterned by a laser patterning process from the back side of the display panel, and the light transmittance of the first display area is improved.

BRIEF DESCRIPTION OF THE SEVERAL VIEWS OF THE DRAWINGS

In order to more clearly illustrate the embodiments of the present application and the prior art, the following figures will be described in the embodiments and the prior art are briefly introduced. It is obvious that the drawings are only some embodiments of the present application, those of ordinary skill in this field can obtain other figures according to these figures without paying the premise.

DESCRIPTION OF SPECIFIC EMBODIMENTS OF THE INVENTION

Figure 1:
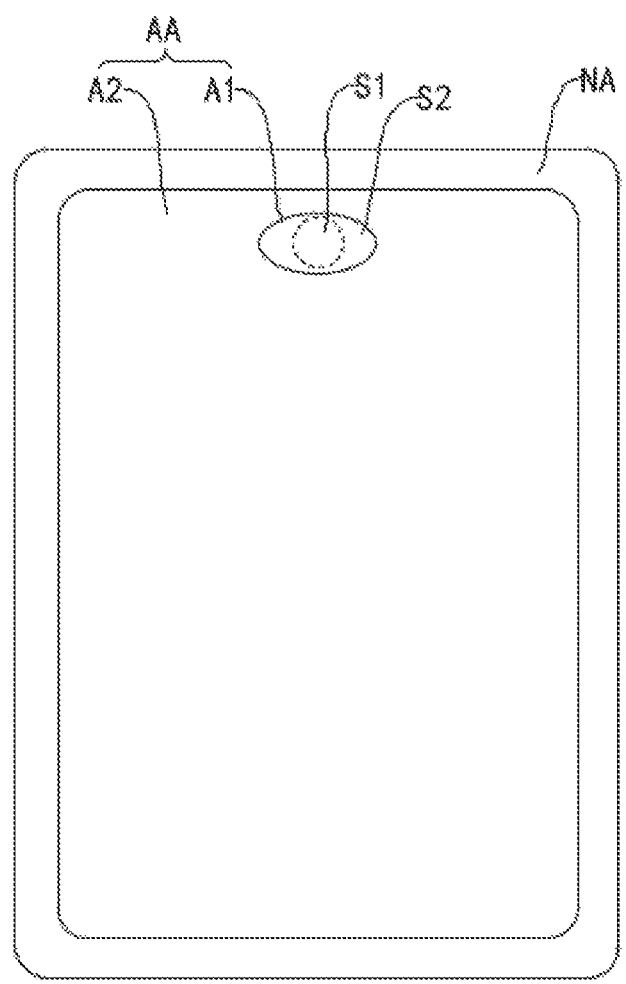
FIG. 1 is a plan view diagram of a display panel provided by an embodiment of the present application.
Figure 2:
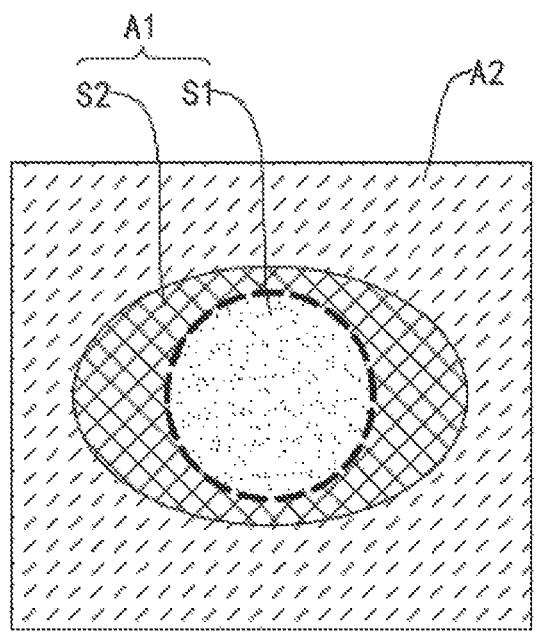
FIG. 2 is a partial enlarged view diagram of a display panel comprising a first display area provided by an embodiment of the present application.
Figure 3:
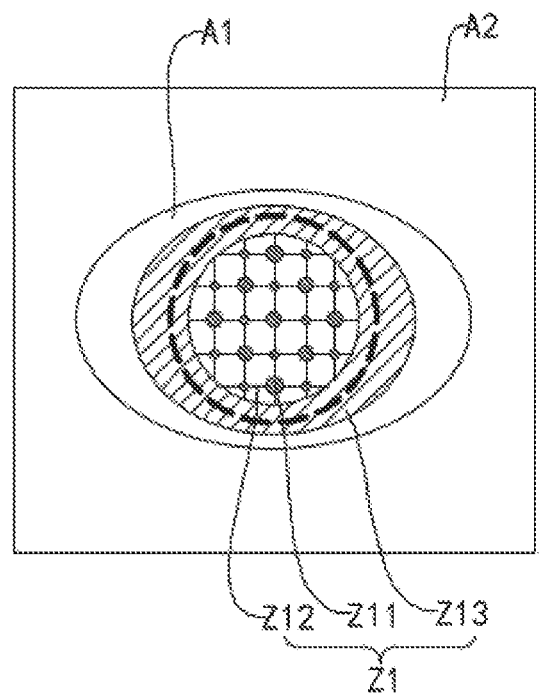
FIG. 3 is a plan view diagram of a first shielding layer arranged in a display panel provided by an embodiment of the present application.

The following descriptions for the respective embodiments are specific embodiments capable of being implemented for illustrations of the present application with referring to appended figures. The terms of up, down, front, rear, left, right, interior, exterior, side, etcetera mentioned in the present application are merely directions of referring to the appended figures. Thus, the used directional terms are used to describe and understand the present application, but the present invention is not limited thereto. In the figure, units with similar structures are denoted by the same reference numerals.

The embodiment of the present application provides a display panel. The display panel comprises a first display area and a second display area adjacent to the first display area. The display panel comprises a substrate layer and a light-emitting layer. The substrate layer comprises a first shielding layer corresponding to the first display area. The light-emitting layer comprises first light-emitting pixels arranged in the first display area and second light-emitting pixels arranged in the second display area, and a number of the first light-emitting pixels is the same as a number of the second light-emitting pixels in a same unit area; the first shielding layer comprises: a first shielding sub-part corresponding to the first light-emitting pixel and a second shielding sub-part connecting two adjacent first shielding sub-parts. In the present application, by providing the first shielding layer comprising the first shielding sub-part and the second shielding sub-part in the first display area, the first shielding layer is employed to shield a part of the light-emitting layer, so that the metal electrode in the light-emitting layer can be patterned by a laser patterning process from the back side of the display panel, and the light transmittance of the first display area is improved.

The structural features, functional features, etc. of the display panel provided by the embodiments of the present application will be described below in conjunction with FIG. 1 to FIG. 8.

The embodiment of the present application provides a display panel. The display panel comprises a display area AA and a non-display area NA adjacent to the display area AA. Optionally, the non-display area NA is around the display area AA, so that the display area AA is surrounded by the non-display area NA. The display area AA is an area used for acting a display function in the display panel, and a plurality of display units for realizing the display function are provided in the display area AA. The non-display area NA may be a frame area of the display panel, and a functional component that assists the display unit in the display area AA to perform display, such as a driver chip, etc., may be arranged in the non-display area NA.

The display area AA comprises a second display area A2 and a first display area A1, and the second display area A2 is arranged adjacent to the first display area A1. It can be understood that the display panel possesses a display function in both the second display area A2 and the first display area A1; The first display area A1 is provided with first light-emitting pixels, and the second display area A2 is provided with second light-emitting pixels, and the number of the first light-emitting pixels is the same as the number of the second light-emitting pixels in a same unit area, so that the first display area A1 and the second display area A2 present the same or similar display effects.

Optionally, the second display area A2 may surround the first display area A1 along the edge of the first display area A1; the first display area A1 may also be located at a side of the second display area A2, so that the second display area A2 partially surrounds the first display area A1.

The first display area A1 comprises a photosensitive area S1 and a transition area S2 that are adjacently arranged. The transition area S2 may surround the photosensitive area S1 along the edge of the photosensitive area S1; the transition area S2 may also be located at a side of the photosensitive area S1, so that the transition area S2 partially surrounds the photosensitive area S1. It can be understood that the display panel possesses a higher light transmittance in the photosensitive area S1, and the photosensitive element is arranged corresponding to the photosensitive area S1, and signals such as light are sensed through the photosensitive area S1. The photosensitive element may be a camera or an optical element of a facial recognition sensor.

Optionally, the display panel possesses the same pixel density and sub-pixel shape in the transition area S2 and the photosensitive area S1. The light transmittance of the photosensitive area S1 is greater than the light transmittance of the transition area S2, and also greater than the light transmittance of the second display area A2.

Furthermore, the display panel comprises a substrate layer 10, a driving circuit layer 20 disposed on the substrate layer 10, a light-emitting layer 30 disposed on the driving circuit layer 20 and an encapsulation layer 40 disposed on the light-emitting layer 30.

Optionally, the substrate layer 10 may comprises a base substrate layer 101 and a buffer layer 102 disposed on the base substrate layer 101. The base substrate layer 101 may be a glass substrate or a polyimide substrate or the like. The buffer layer 102 may comprises a single layer or multiple layers, and the buffer layer 102 is made of inorganic materials, such as silicon nitride.

The substrate layer 10 further comprises a first shielding layer Z1 (refer to FIG. 3 and FIG. 8), and at least a part of the area of the first shielding layer Z1 is located in the photosensitive area S1. Optionally, a part of the area of the first shielding layer Z1 can also be located in the transition area S2.

The substrate layer 10 further comprises a second shielding layer Z2. The second shielding layer Z2 is arranged corresponding to the second display area A2.

Optionally, the first shielding layer Z1 and the second shielding layer Z2 may be located between the substrate layer 101 and the buffer layer 102, or in the buffer layer, which is stacked with multiple layers. The first shielding layer Z1 and the second shielding layer Z2 can be made of the same material. The materials for preparing the first shielding layer Z1 and the second shielding layer Z2 comprise aluminum, platinum, palladium, silver, molybdenum, lithium, tungsten and the like. The thickness of the first shielding layer Z1 and the second shielding layer Z2 can be between 500 angstroms and 5000 angstroms.

The driving circuit layer 20 is provided with a driving circuit and various wirings, a plurality of thin film transistors and a plurality of input/output terminals for realizing the driving circuit. The driving circuit layer 20 is employed to provide driving signals and control signals for each light-emitting element in the light-emitting layer 30.

Specifically, the driving circuit layer 20 comprises: a semiconductor layer 201 disposed on the substrate layer 10, a first gate insulating layer 202 covering the semiconductor layer 201, a first gate 203 disposed on the first gate insulating layer 202, a second gate insulating layer 204 covering the first gate 203, a second gate 206 disposed on the second gate insulating layer 204, an interlayer insulating layer 207 covering the second gate 206, source and drain electrodes 208 disposed on the interlayer insulating layer 207 and a planarization layer 209 covering the source and drain electrodes 208. The source and drain electrodes 208 are electrically connected to opposite ends of the semiconductor layer 201; the semiconductor layer 201, the first gate 203, the second gate 206, and the source and drain electrodes 208 corresponding to one another constitute a thin film transistor.

The driving circuit layer 20 comprises a plurality of thin film transistors as described above. Specifically it comprises a plurality of second transistors T2 provided corresponding to the second display area A2 and a plurality of first transistors T1 provided corresponding to the first display area A1. The second shielding layer Z2 is provided corresponding to the second transistor T2, and a partial area of the first shielding layer Z1 is provided corresponding to the first transistor T1.

The driving circuit layer 20 further comprises: a first wiring electrically connected to the first transistor T1 and providing a driving signal for the first transistor T1, and a second wiring connecting the first transistor T1 and the first light-emitting pixel. The first wiring may be a data line, a scan line, etc., and the second wiring may be a wiring connecting the first transistor T1 and the anode of the first light-emitting pixel.

Furthermore, the orthographic projection of the semiconductor layer 201 of the second transistor T2 on the substrate layer 10 overlaps with at least a part of the second shielding layer Z2. The second shielding layer Z2 is employed to shield the light from the back of the display panel toward the semiconductor layer 201 of the second transistor T2, so as to prevent the second transistor T2 from being interfered by the light and affecting the performance stability thereof. The orthographic projection of the semiconductor layer 201 of the first transistor T1 on the substrate layer 10 overlaps with a part of the first shielding layer Z1. The first shielding layer Z1 is employed to shield the light from the back of the display panel toward the semiconductor layer 201 of the first transistor T1, so as to prevent the first transistor T1 from being interfered by the light and affecting the performance stability thereof.

Optionally, the orthographic projection of the second shielding layer Z2 on the driving circuit layer 20 overlaps with the second transistor T2. The second shielding layer Z2 provided corresponding to the second transistor T2 and the part of the first shielding layer Z1 provided corresponding to the first transistor T1 are both electrically connected to the electrifying wiring 205 located in the driving circuit layer 20. The electrifying wiring 205 provides a specific voltage to the second shielding layer Z2 and the part of the first shielding layer Z1 to eliminate static electricity generated on the second shielding layer Z2 and the first shielding layer Z1, to prevent the wirings in the driving circuit layer 20 from being damaged due to electrostatic discharge.

The first electrode 301, the light-emitting material layer 302 and the second electrode 303 corresponding to one another constitute a light-emitting pixel. The light-emitting layer 30 comprises a plurality of such light-emitting pixels to realize its light-emitting display function.

Optionally, the first transistor T1 may be arranged in the photosensitive area S1 and the transition area S2, or only in the transition area S2. When the first transistor T1 is only arranged in the transition area S2, the light transmittance of the photosensitive area S1 can be further improved.

Furthermore, when the first transistor T1 is only arranged in the transition area S2, the first electrode 301 located in the photosensitive area S1 and the transition area S2 is electrically connected to the first transistor T1, and an electrical signal is provided to the first electrode 301 of the photosensitive area S1 and the transition area S2 through the first transistor T1 to control the light-emitting function of the light-emitting unit located in the photosensitive area S1 and the transition area S2. The first electrode 301 located in the second display area A2 is electrically connected to the second transistor T2, and an electrical signal is provided to the first electrode 301 of the second display area A2 through the second transistor T2 to control the light-emitting function of the light-emitting unit located in the second display area A2.

It can be understood that, in this embodiment, the thin film transistor for controlling the light-emitting unit of the photosensitive area S1 is arranged in the transition area S2. The number of thin film transistors and the number of wirings in the photosensitive area S1 are reduced, and the light transmittance of the display panel in the photosensitive area S1 is improved.

Optionally, the first electrode 301 is an anode, the second electrode 303 is a cathode, and the hole carriers of the first electrode 301 and the electron carriers of the second electrode 303 are combined in the light-emitting material layer 302 and emit light.

The encapsulation layer 40 completely covers the light-emitting layer 30 and is employed to seal and protect the light-emitting layer 30. The encapsulation layer 40 may be a composite structure film layer formed by stacking an organic layer, an inorganic layer and an organic layer.

The structural features of the first shielding layer Z1 will be described below with reference to FIG. 2 to FIG. 8.

Optionally, the first shielding layer Z1 is located in the photosensitive area S1 and part of the transition area S2. The orthographic projection of the patterned second electrode 303 located in the photosensitive area S1 on the substrate layer 10 overlaps with at least part of the first shielding layer Z1, and the first shielding layer Z1 possesses a patterned structure. In this embodiment, by providing the first shielding layer Z1 corresponding to the photosensitive area S1, and employing the first shielding layer Z1 to shield the second electrode 303 of the photosensitive area S1, the second electrode 303 can be patterned by employing a laser patterning process from the back side of the display panel to form the patterned second electrode 303, which further improves the light transmittance of the photosensitive area S1.

Furthermore, the first shielding layer Z1 comprises: a plurality of first shielding sub-parts Z11 arranged corresponding to the first light-emitting pixels, a third shielding sub-part Z13 that at least partially surrounds the plurality of first shielding sub-parts Z11 and a second shielding sub-part Z12 connecting two adjacent first shielding sub-parts Z11. Optionally, the second shielding sub-part Z12 may also connect the adjacent first shielding sub-part Z11 and the third shielding sub-part Z13. It can be understood that the first shielding sub-part Z11, the third shielding sub-part Z13 and the second shielding sub-part Z12 are all connected to one another to form an unitary body; the first shielding layer Z1 is patterned and distributed in areas corresponding to at least the first shielding sub-part Z11 and the second shielding sub-part Z12, a certain hollow area exists inside to ensure that the photosensitive area S1 possesses better light transmittance.

The second shielding layer Z2 comprises fourth shielding sub-parts corresponding to the second transistors T2. Optionally, a number of the first shielding sub-parts Z11 is the same as a number of the fourth shielding sub-parts in a same unit area.

Optionally, when the first transistor T1 is arranged in the transition area S2, in the photosensitive area S2, the second shielding sub-part Z12 is arranged to overlap with the second wiring, and a width of the second shielding sub-part Z12 is greater than a width of the second wiring, to form a shielding protection for the second wiring, to prevent the second wiring from being damaged when the second electrode 303 is patterned by laser. Then, the first wiring is arranged around the edge of the photosensitive area S1 around the transition area S2, and the third shielding sub-part Z13 overlaps with the first wiring, which is at least partially arranged around the edge of the photosensitive area S1 to form the shielding protection for the first wiring. In addition, a partial area of the third shielding sub-part Z13 overlaps with the first transistor T1 to form a shielding protection for the first transistor T1.

Optionally, the first transistor T1 is arranged in the photosensitive area S1, and the first shielding sub-part Z11 is arranged to overlap with the first transistor T1, and the second shielding sub-part Z12 is arranged to overlap with the first wiring, and a width of the second shielding sub-part Z12 is greater than a width of the first wiring, thereby forming a shielding protection for the first transistor T1 and the first wiring.

Besides, the first shielding sub-part Z11 also shields the first electrode 301 and the light-emitting material layer 302 located in the photosensitive area S1 to prevent the laser from causing damage to the first electrode 301 and the light-emitting material layer 302 during the patterning process of the second electrode 303.

The third shielding sub-part Z13 at least covers the boundary between the photosensitive area S1 and the transition area S2. It can be understood that there are a larger number of thin film transistors and connection lines, such as data lines and scan lines, etc., arranged in the transition area S2. In this embodiment, the third shielding sub-part Z13 at least covers the boundary between the photosensitive area S1 and the transition area S2, to prevent the laser from causing damage to the wirings and the thin film transistors in the transition area S2 during the patterning process of the second electrode 303 in the photosensitive area S1.

Optionally, the transition area S2 is arranged in a full circle around the photosensitive area S1. Correspondingly, the third shielding sub-part Z13 is also arranged in a full circle around the first shielding sub-part Z11 and the second shielding sub-part Z12, so as to form shielding and protection for the wirings and the thin film transistors in the transition area S2 located at the edge of the photosensitive area S1.

Furthermore, the first part of the third shielding sub-part Z13 is located in the photosensitive area S1, and the second part of the third shielding sub-part Z13 is located in the transition area S2. In this embodiment, the third shielding sub-part Z13 extends across the photosensitive area S1 into the transition area S2, and further enhances the protection for the thin film transistors and the connection wirings in the transition area S2.

Furthermore, based on the control of the precision of the laser patterning process and the protection of the wirings of the transition area S2, the distance between the edge of the third shielding sub-part Z13 located in the photosensitive area S1 and the edge of the transition area S2 close to the photosensitive area S1 is greater than or equal to 1 micrometer. The distance between the edge of the third shielding sub-part Z13 located in the photosensitive area S1 and an edge of the third shielding sub-part Z13 located in the transition area S2 is greater than or equal to 10 micrometers.

Optionally, the third shielding sub-part Z13 may also completely cover the transition area S2 to form a comprehensive protection for the thin film transistors and the connection wirings in the transition area S2. The part of the third shielding sub-part Z13 located in the transition area S2 corresponding to the area of the semiconductor layer 201 is electrically connected to the second wiring to obtain a specific voltage and prevent the accumulation of static electricity.

Optionally, the orthographic projection of the third shielding sub-part Z13 on the driving circuit layer 20 covers at least part of the first transistor T1 to shield the light emitted from the back of the display panel toward the first transistor T1, to prevent the laser from causing damage to the first transistor T1 during the patterning process of the second electrode 303 in the photosensitive area S1.

Furthermore, the shape of the first shielding sub-part Z11 is the same as the shape of the corresponding first electrode 301. The distance between the edge of the orthographic projection of the first shielding sub-part Z11 on the light-emitting layer 30 and the edge of the corresponding first electrode 301 is greater than or equal to 2 micrometers. The design of this embodiment can fully protect the first electrode 301 from damage caused by laser when the second electrode 303 is patterned by laser. Optionally, the shape of the first electrode 301 comprises one or more of a circle, an ellipse and a polygon; and the shape of the main first electrode and the first shielding sub-part Z11 in the second electrode 303 also comprises one or more of a circle, an ellipse and a polygon corresponding to the shape of the first electrode 301.

The display panel further comprises a first wiring electrically connected to the first electrode 301 and the first transistor T1 in the photosensitive area S1, and the orthographic projection of the second shielding sub-part Z12 on the light-emitting layer 30 covers the first wiring. It can be understood that as performing laser patterning on the second electrode 303 located in the photosensitive area S1, the second shielding sub-part Z12 shields the light directed to the first wiring to ensure that the first wiring is protected from laser damage.

Optionally, based on the control of the precision of the laser patterning process, the distance between the edge of the orthographic projection of the second shielding sub-part Z12 on the light-emitting layer 30 and the edge of the corresponding first wiring is configured to be greater than or equal to 2 micrometers, to achieve effective protection of the first wiring.

Figure 4:
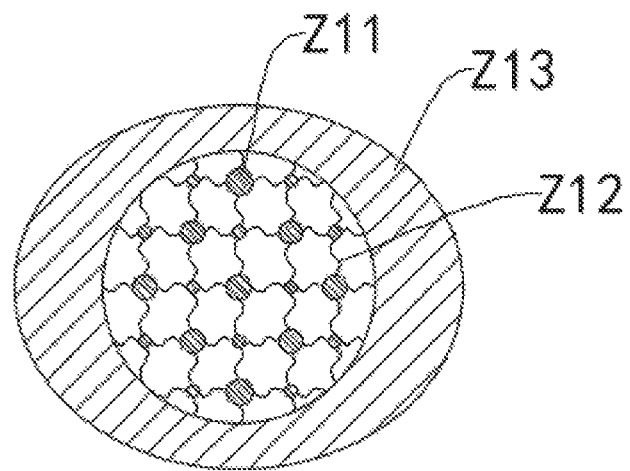
FIG. 4 is a second structural diagram of the first shielding layer of the display panel provided by an embodiment of the present application.

Furthermore, the shape of the first wiring is curved, such as a serpentine wiring, etc., and the shape of the second shielding sub-part Z12 corresponding to the first wiring is also curved (as shown in FIG. 4). On this basis, the shape of at least part of the second electrode of the photosensitive area S1 is also a curved shape corresponding to the shape of the second shielding sub-part Z12.

Figure 5:
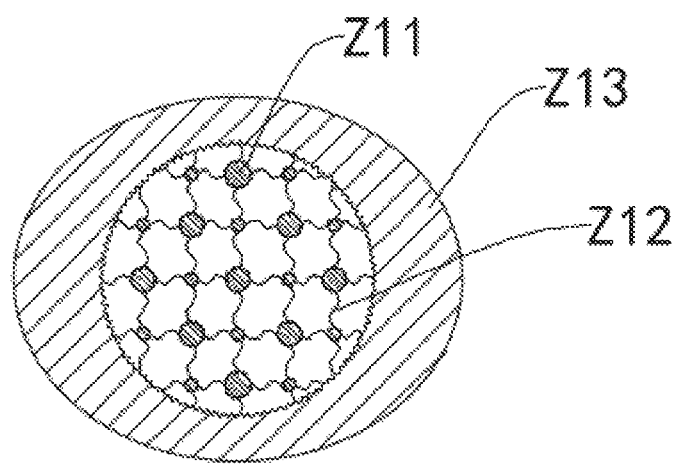
FIG. 5 is a third structural diagram of the first shielding layer of the display panel provided by an embodiment of the present application.
Figure 6:
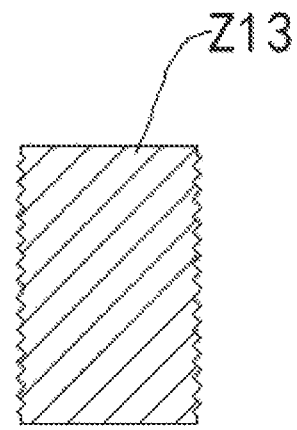
FIG. 6 is a structural diagram of the third shielding sub-part shown in FIG. 5.
Figure 7:
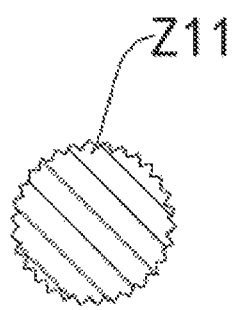
FIG. 7 is a structural diagram of the first shielding sub-part shown in FIG. 5.
Figure 8:
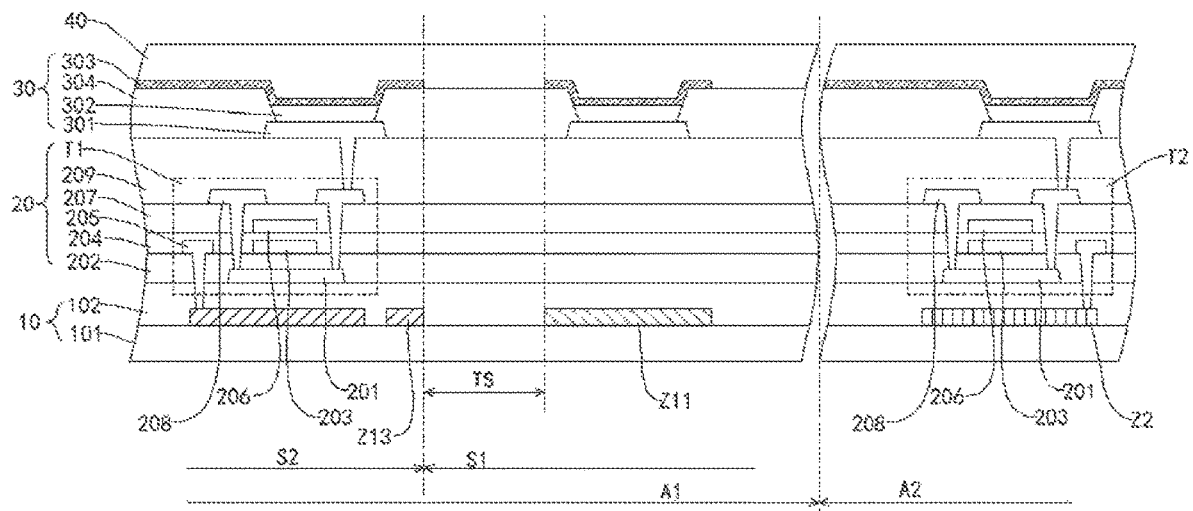
FIG. 8 is a partial cross-sectional view diagram of a display panel provided by an embodiment of the present application.

Furthermore, an edge of at least part of the first shielding sub-parts Z11 is wavy or jagged, and an edge of the third shielding sub-part Z13 close to the photosensitive area S1 is wavy or jagged, and edges of the second shielding sub-parts Z12 are wavy or jagged (as shown in FIG. 5 to FIG. 7). It can be understood that the light-shielding structure with wavy or jagged edges of this embodiment can reduce the diffraction effect when light passes through the photosensitive area S1, and further improve the light transmittance of the photosensitive area S1.

Optionally, the shape of the photosensitive area S1 is a circle or an ellipse, and the shape of the edge of the transition area S2 close to the second display area A2 is an ellipse, and the shape of the edge of the transition area S2 close to the photosensitive area S1 is circular.

In conclusion, in the embodiment of the present application, by electrically connecting the first electrode 301 of the photosensitive area S1 to the first transistor T1, the number of metal wirings and thin film transistors in the photosensitive area S1 is reduced and the light transmittance of the photosensitive area S1 is improved. Meanwhile, the first shielding layer Z1 is employed to shield the second electrode 303 of the photosensitive area S1, so that the second electrode 303 can be patterned from the back side of the display panel by employing a laser patterning process to form the patterned second electrode. The light transmittance of the photosensitive area S1 is further increased, which is beneficial to realize the efficient lighting of the photosensitive element.

The embodiment of the present application further provides a manufacturing method of a display panel, employed to manufacture the aforesaid display panel.

Please refer to FIG. 1 to FIG. 8. The display panel comprises a display area AA and a non-display area NA adjacent to the display area AA. The display area AA comprises a second display area A2 and a first display area A1 adjacent to the second display area A2. The first display area A1 comprises a photosensitive area S1 and a transition area S2 adjacent to the photosensitive area S1. The manufacturing method of the display panel, comprising steps of:

Step S101, preparing a substrate layer 10, wherein the substrate layer 10 comprises a first shielding layer Z1 corresponding to the first display area A1, and the first shielding layer Z1 comprises a first shielding sub-part Z11 and a second shielding sub-part Z12 connecting two adjacent first shielding sub-parts Z11.

Optionally, the first shielding layer Z1 further comprises a third shielding sub-part Z13 arranged around the first shielding sub-part Z11 and the second shielding sub-part Z12.

Optionally, the substrate layer 10 further comprises a second shielding layer Z2 corresponding to the second display A2. The materials for preparing the first shielding layer Z1 and the second shielding layer Z2 comprise aluminum, platinum, palladium, silver, molybdenum, lithium, tungsten and the like. The thickness of the first shielding layer Z1 and the second shielding layer Z2 can be between 500 angstroms and 5000 angstroms.

Step S102, preparing an original metal layer on a side of the substrate layer 10.

Specifically, before Step S102, the method further comprises: preparing a driving circuit layer 20 on the substrate layer 10. The driving circuit layer 20 comprises a plurality of second transistors T2 provided corresponding to the second display area A2 and a plurality of first transistors T1 provided corresponding to the first display area A1. The orthographic projection of the second shielding layer Z2 on the driving circuit layer 20 covers the second transistor T2. The orthographic projection of the first shielding layer Z1 on the driving circuit layer 20 covers the first transistor T1. Regarding the more specific structure and arrangement characteristics of the first shielding layer Z1 and the second shielding layer Z2, please refer to the foregoing embodiments, and will not be repeated here.

The first electrode 301 and the light-emitting material layer 302 located on the first electrode 301 are fabricated on the driving circuit layer 20, so that the first electrode 301 located in the photosensitive area S1 and the transition area S2 is electrically connected to the first transistor T1 and the first electrode 301 located in the second display area A2 is electrically connected to the second transistor T2.

In Step S102, the original metal layer is a semi-transparent metal layer covering the entire surface, and the original metal layer is electrically connected to the light-emitting material layer 302.

Step S103, employing laser to irradiate the original metal layer located in the photosensitive area S1 from the side of the substrate layer 10. Part of the laser is shielded by the first shielding sub-part Z11 and the second shielding sub-part Z12, and other part of the laser is irradiated to the original metal layer through the hollow area on the first shielding layer Z1, so that part of the area in the original metal layer is melted or weakened by the high temperature generated by laser.

Figure 9:
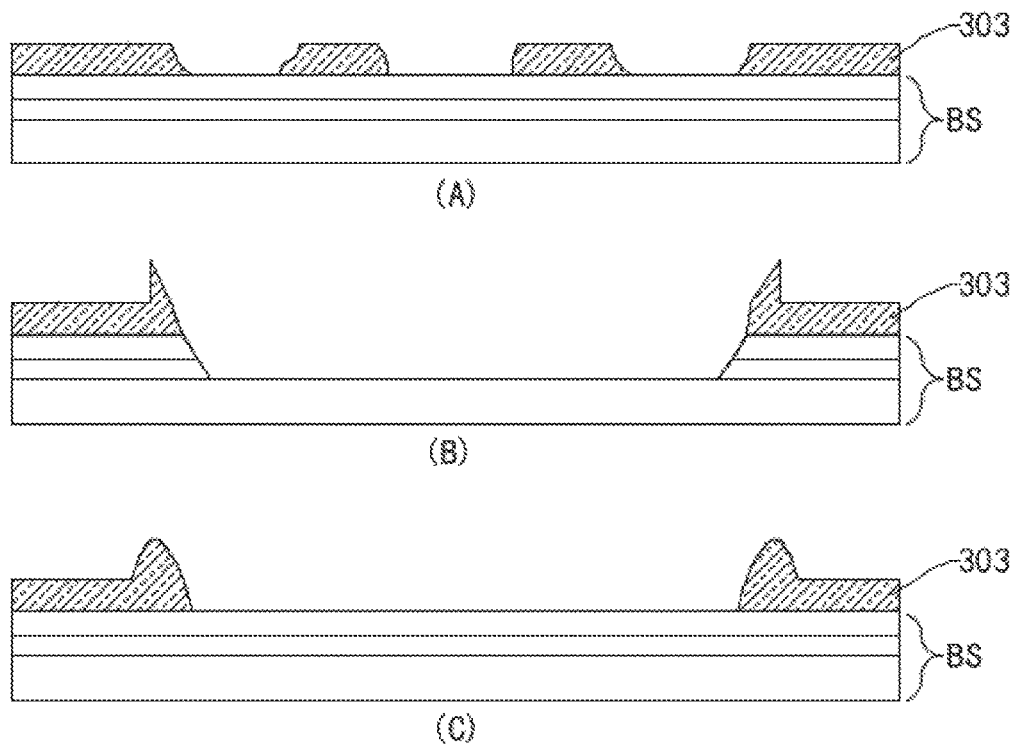
FIG. 9 shows the difference in shapes of the second electrode formed under different laser energies.

When laser is employed to pattern the original metal layer, the intensity of the laser needs to be controlled. Please refer to FIG. 9, which shows the difference in shapes of the second electrode 303 formed by patterning the original metal layer under different laser energies. BS represents the film layers below the second electrode 303. In (A), the employed laser energy is low, and the problem of incomplete patterning of the original metal layer will occur, which affects the light transmittance of the ultimate photosensitive area S1. In (B), the employed laser energy is too high, and the film layers BS below the second electrode 303 are damaged by the laser, and the edge of the second electrode 303 forms thorn-like protrusions, which seriously affects the performance of the display panel. In (C), the employed laser energy is moderate, and the film layers BS below the second electrode 303 remains intact, and the edge of the second electrode 303 is smooth. In this case, the performance of the produced display panel is the best.

The manufacturing method of the display panel further comprises a step of preparing an encapsulation layer 40 covering the second electrode 303.

Another embodiment of the present application further provides a display device. The display device comprises the display panel provided by the aforesaid embodiments of the present application and a photosensitive element arranged on a side of the display panel close to the substrate layer 10. The photosensitive element is arranged corresponding to the photosensitive area S1 in the first display area of the display panel, so as to obtain external light through the photosensitive area S1. In practical applications, the photosensitive element can be a camera, a fingerprint recognition sensor, an infrared sensor, etc., and there is no limitation here.

Specifically, although the above specific embodiments of the present application are disclosed, the foregoing specific embodiments are not intended to limit the present application, those skilled in the art can make various kinds of alterations and modifications without departing from the spirit and scope of the present application. Thus, the scope of protection of the present application is defined by the scope of the claims.

What is claimed is:

1. A display panel, comprising a first display area and a second display area adjacent to the first display area, wherein the display panel comprises:
    a substrate layer, comprising a first shielding layer corresponding to the first display area;
    a light-emitting layer arranged on a side of the substrate layer, wherein the light-emitting layer comprises: first light-emitting pixels arranged in the first display area and second light-emitting pixels arranged in the second display area, and a number of the first light-emitting pixels is the same as a number of the second light-emitting pixels in a same unit area;
    wherein the first shielding layer comprises: a first shielding sub-part corresponding to the first light-emitting pixel and a second shielding sub-part connecting two adjacent first shielding sub-parts;
    wherein the first display area comprises a photosensitive area and a transition area arranged between the photosensitive area and the second display area;
    the first shielding sub-part further comprises: a third shielding sub-part arranged around the first shielding sub-part and the second shielding sub-part, wherein the second shielding sub-part is connected to two adjacent first shielding sub-parts, and the second shielding sub-part is connected to the adjacent first shielding sub-part and the third shielding sub-part;
    the third shielding sub-part is arranged corresponding to an edge of the photosensitive area;
    wherein the display panel further comprises:
    a driving circuit layer, arranged between the substrate layer and the light-emitting layer, wherein the driving circuit layer comprises a plurality of first transistors arranged corresponding to the first display area and a plurality of second transistors arranged corresponding to the second display area;
    the substrate layer further comprises a second shielding layer corresponding to the second display area, and the second shielding layer comprises fourth shielding sub-parts corresponding to the second transistors, and a number of the first shielding sub-parts is the same as a number of the fourth shielding sub-parts in a same unit area;
    wherein the driving circuit layer further comprises: a first wiring being electrically connected to the first transistor and providing a driving signal for the first transistor, and a second wiring connecting the first transistor and the first light-emitting pixel;

wherein in the photosensitive area, the second shielding sub-part overlaps with the first wiring and/or the second wiring;

wherein the first transistor is arranged in the transition area; in the photosensitive area, the second shielding sub-part is arranged to overlap with the second wiring, and a width of the second shielding sub-part is greater than a width of the second wiring.

2. The display panel according to claim 1, wherein the third shielding sub-part further partially overlaps with the transition area.

3. The display panel according to claim 2, wherein a distance between an edge of the third shielding sub-part located in the photosensitive area and an edge of the transition area close to the photosensitive area is greater than or equal to 1 micrometer.

4. The display panel according to claim 3, wherein a distance between the edge of the third shielding sub-part located in the photosensitive area and an edge of the third shielding sub-part located in the transition area is greater than or equal to 10 micrometers.

5. The display panel according to claim 4, wherein the third shielding sub-part completely covers the transition area.

6. The display panel according to claim 1, wherein the light-emitting layer comprises:
a first electrode, arranged on a side of the substrate layer;
a light-emitting material layer, arranged on a side of the first electrode away from the substrate layer;
a second electrode, arranged on a side of the light-emitting material layer away from the substrate layer;
wherein the second electrode in the first display area corresponds to an area surrounded by the adjacent first shielding sub-part and the second shielding sub-part, and/or a light-transmitting hole is provided corresponding to an area surrounded by the adjacent first shielding sub-part, the second shielding sub-part and the third shielding sub-part, and the light-transmitting hole does not overlap with the first shielding layer.

7. The display panel according to claim 6, wherein a distance between an edge of the orthographic projection of the first shielding sub-part on the light-emitting layer and an edge of the corresponding first electrode is greater than or equal to 2 micrometers.

8. The display panel according to claim 7, wherein the third shielding sub-part overlaps with a first transistor.

9. The display panel according to claim 7, wherein a shape of the first shielding sub-part is the same as a shape of the corresponding first electrode.

10. The display panel according to claim 1, wherein the fourth shielding sub-parts are electrified.

11. The display panel according to claim 1, wherein the first wiring is arranged around the edge of the photosensitive area around the transition area, and the third shielding sub-part overlaps with the first wiring, which is at least partially arranged around the edge of the photosensitive area.

12. The display panel according to claim 1, wherein a shape of the second wiring is curved, and a shape of the second shielding sub-part corresponding to the second wiring is curved.

13. The display panel according to claim 1, wherein an edge of at least part of the first shielding sub-parts is wavy or jagged, and edges of the second shielding sub-parts are wavy or jagged, and an edge of the third shielding sub-part close to the photosensitive area is wavy or jagged.

14. The display panel according to claim 1, wherein a shape of the photosensitive area comprises a circle or an ellipse, and an edge shape of the transition area close to the second display area comprises an ellipse.

15. A display panel, comprising a first display area and a second display area adjacent to the first display area, wherein the display panel comprises:
a substrate layer, comprising a first shielding layer corresponding to the first display area;
a light-emitting layer arranged on a side of the substrate layer, wherein the light-emitting layer comprises: first light-emitting pixels arranged in the first display area and second light-emitting pixels arranged in the second display area, and a number of the first light-emitting pixels is the same as a number of the second light-emitting pixels in a same unit area;
wherein the first shielding layer comprises: a first shielding sub-part corresponding to the first light-emitting pixel and a second shielding sub-part connecting two adjacent first shielding sub-parts;
wherein the first display area comprises a photosensitive area and a transition area arranged between the photosensitive area and the second display area;
the first shielding sub-part further comprises: a third shielding sub-part arranged around the first shielding sub-part and the second shielding sub-part, wherein the second shielding sub-part is connected to two adjacent first shielding sub-parts, and the second shielding sub-part is connected to the adjacent first shielding sub-part and the third shielding sub-part;
the third shielding sub-part is arranged corresponding to an edge of the photosensitive area;
wherein the display panel further comprises:
a driving circuit layer, arranged between the substrate layer and the light-emitting layer, wherein the driving circuit layer comprises a plurality of first transistors arranged corresponding to the first display area and a plurality of second transistors arranged corresponding to the second display area;
the substrate layer further comprises a second shielding layer corresponding to the second display area, and the second shielding layer comprises fourth shielding sub-parts corresponding to the second transistors, and a number of the first shielding sub-parts is the same as a number of the fourth shielding sub-parts in a same unit area;
wherein the driving circuit layer further comprises: a first wiring being electrically connected to the first transistor and providing a driving signal for the first transistor, and a second wiring connecting the first transistor and the first light-emitting pixel;
wherein in the photosensitive area, the second shielding sub-part overlaps with the first wiring and/or the second wiring;
wherein the first transistor is arranged in the photosensitive area, and the first shielding sub-part is arranged to overlap with the first transistor, and the second shielding sub-part is arranged to overlap with the first wiring, and a width of the second shielding sub-part is greater than a width of the first wiring.

16. A display device, comprising a substrate and a photosensitive element corresponding to a first display area of a display panel;

the display panel comprises: the first display area and a second display area adjacent to the first display area, and the display panel comprises:
a substrate layer, comprising a first shielding layer corresponding to the first display area;
a light-emitting layer arranged on a side of the substrate layer, wherein the light-emitting layer comprises: first light-emitting pixels arranged in the first display area and second light-emitting pixels arranged in the second display area, and a number of the first light-emitting pixels is the same as a number of the second light-emitting pixels in a same unit area;
wherein the first shielding layer comprises: a first shielding sub-part corresponding to the first light-emitting pixel and a second shielding sub-part connecting two adjacent first shielding sub-parts;
wherein the first display area comprises a photosensitive area and a transition area arranged between the photosensitive area and the second display area;
the first shielding sub-part further comprises: a third shielding sub-part arranged around the first shielding sub-part and the second shielding sub-part, wherein the second shielding sub-part is connected to two adjacent first shielding sub-parts, and the second shielding sub-part is connected to the adjacent first shielding sub-part and the third shielding sub-part;
the third shielding sub-part is arranged corresponding to an edge of the photosensitive area;
wherein the display panel further comprises:
a driving circuit layer, arranged between the substrate layer and the light-emitting layer, wherein the driving circuit layer comprises a plurality of first transistors arranged corresponding to the first display area and a plurality of second transistors arranged corresponding to the second display area;
the substrate layer further comprises a second shielding layer corresponding to the second display area, and the second shielding layer comprises fourth shielding sub-parts corresponding to the second transistors, and a number of the first shielding sub-parts is the same as a number of the fourth shielding sub-parts in a same unit area;
wherein the driving circuit layer further comprises: a first wiring being electrically connected to the first transistor and providing a driving signal for the first transistor, and a second wiring connecting the first transistor and the first light-emitting pixel;
wherein in the photosensitive area, the second shielding sub-part overlaps with the first wiring and/or the second wiring;
wherein the first transistor is arranged in the transition area; in the photosensitive area, the second shielding sub-part is arranged to overlap with the second wiring, and a width of the second shielding sub-part is greater than a width of the second wiring.

* * * * *